(12) United States Patent
Kang

(10) Patent No.: US 7,102,925 B2
(45) Date of Patent: Sep. 5, 2006

(54) FLASH MEMORY DEVICE

(75) Inventor: Hyeok Kang, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 565 days.

(21) Appl. No.: 10/470,609

(22) Filed: Jun. 27, 2003

(65) Prior Publication Data

US 2004/0219729 A1    Nov. 4, 2004

(30) Foreign Application Priority Data

Nov. 20, 2002  (KR) ..................... 10-2002-0072240

(51) Int. Cl.
*G11C 11/34* (2006.01)
(52) U.S. Cl. ............... 365/185.11; 365/230.03; 365/185.04
(58) Field of Classification Search ........... 365/185.01, 365/185.04, 185.11, 230.03
See application file for complete search history.

(56) References Cited

U.S. PATENT DOCUMENTS 6,401,164 B1 *  6/2002  Bartoli et al. ............... 711/103
6,598,157 B1 *  7/2003  McKee ........................ 713/1
6,643,758 B1 * 11/2003  Furuyama et al. ......... 711/203
2002/0099920 A1 *  7/2002  Shoji ......................... 711/170
2004/0015671 A1 *  1/2004  Kondo ....................... 711/173

FOREIGN PATENT DOCUMENTS

JP        2004310979 A   * 11/2004

* cited by examiner

*Primary Examiner*—Richard Elms
*Assistant Examiner*—Alexander Sofocleous
(74) *Attorney, Agent, or Firm*—Mayer, Brown, Rowe and Maw LLP

(57) ABSTRACT

A flash memory device including a boot location select signal for selecting location of a boot region is generated by coding it in a CFI block, generated depending on the state of the OTP cell in the protection block, or generated by applying the power supply voltage or the ground voltage as a metal option. The bank select circuit needs not be modified even though location of the boot region is changed. It is thus possible to shorten development time, simplify a verification work and reduce the size of a chip.

7 Claims, 4 Drawing Sheets

FLASH MEMORY DEVICE

BACKGROUND OF THE INVENTION

1. Field of the Invention

The present invention relates to a flash memory device, and more particularly, a flash memory device where a bank select circuit needs not to be modified even though location of the boot region is changed after completion of a design.

2. Background of the Related Art

A flash memory device being a nonvolatile memory device has a memory cell array where a boot region and a user region are divided. At this time, the boot region is a region for storing system information, which is not allowed to be freely rewritten by a user. The user region is a region that could be freely rewritten by a user.

Data stored at the boot region could be executed by setting a given operating mode by a user. This boot region is located at the start portion or an end portion of the memory cell array, i.e., the top or bottom of the memory cell array. The location of the boot region may be changed depending on circumstances requested by an application. Thus, it is necessary for the developer and designer of the flash memory device to consider the two things. At a time point when development is about to be finished, the start portion or the end portion may be decided, or these portions may be developed as an individual product. For this reason, there is a load that the circuit has to be verified twice. Furthermore, the bank select circuit for controlling the operation of the bank must be modified by selecting the bank depending on the location of the boot region. Meanwhile, a flash memory device in which the boot region is not located only at one place of the top and bottom of the memory cell array but is located both at the top and bottom, has been developed. Therefore, a method of managing the boot region of the three modes is required and bank select circuit has to be modified accordingly. Due to this, there are problems that not only respective circuits must be individually discriminated in designing the flash memory but also time taken to verify the circuits is increased and size of the chip is increased.

SUMMARY OF THE INVENTION

Accordingly, the present invention is contrived to substantially obviate one or more problems due to limitations and disadvantages of the related art.

An object of the present invention is to provide a flash memory device where a bank select circuit needs not to be modified even though a boot location select signal for changing location of the boot region is changed.

Another object of the present invention is to provide a flash memory device where a bank select circuit needs not to be modified even though location of the boot region is changed, by generating a boot location select signal by coding it using a CFI (common flash interface) block.

Still another object of the present invention is to provide a flash memory device where a bank select circuit needs not to be modified even though location of the boot region is changed, by generating a boot location select signal depending on the status of an OTP (one time program) cell in a protection block.

Further still another object of the present invention is to provide a flash memory device where a bank select circuit needs not to be modified even though location of the boot region is changed, by generating a boot location select signal by applying the power supply voltage or the ground voltage in a metal option.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flash memory device according to a preferred embodiment of the present invention is characterized in that it comprises a latch means for latching an address signal, a first switching means for selectively outputting an output signal of the latch means or its inverted signal according to a boot location select signal and its inverted signal, a first carry counter for outputting a bank read signal and a first carry output signal according to the output signal of the first switching means, a first carry input signal and a plurality of control signals, a second carry counter for outputting a bank write signal and a second carry output signal according to the output signal of the first switching means, a second carry input signal and the plurality of the control signals, a second switching means for selectively outputting the bank read signal or the bank write signal to control the operation of a first bank, according to the first bank select signal and its inverted signal, and a third switching means for selectively outputting the bank read signal or the bank write signal to control the operation of a second bank, according to the second bank select signal and its inverted signal.

In another aspect of the present invention, it is to be understood that both the foregoing general description and following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1A:
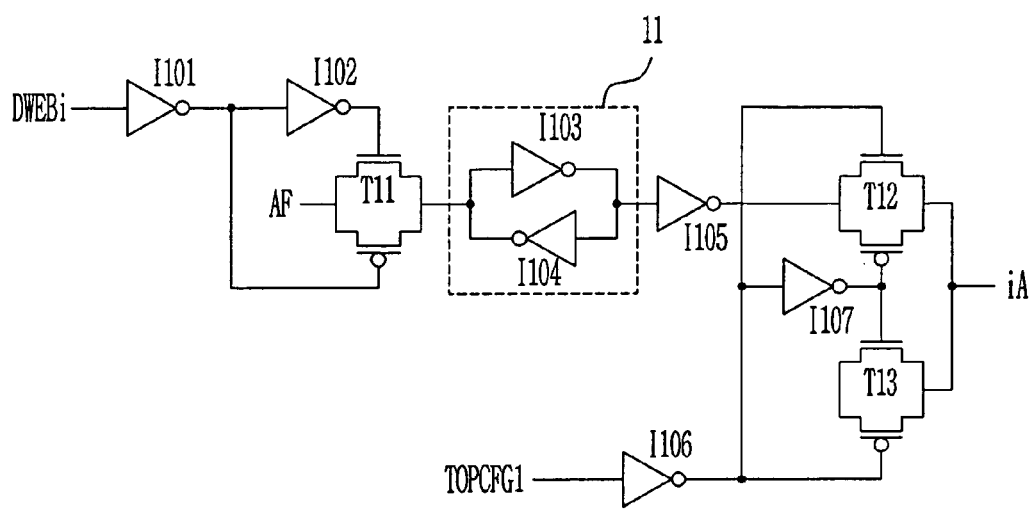
FIG. 1 is a bank select circuit of a flash memory device according to the present invention.

Reference will now be made in detail to the preferred embodiments of the present invention, examples of which are illustrated in the accompanying drawings, in which like reference numerals are used to identify the same or similar parts.

Figure 1B:
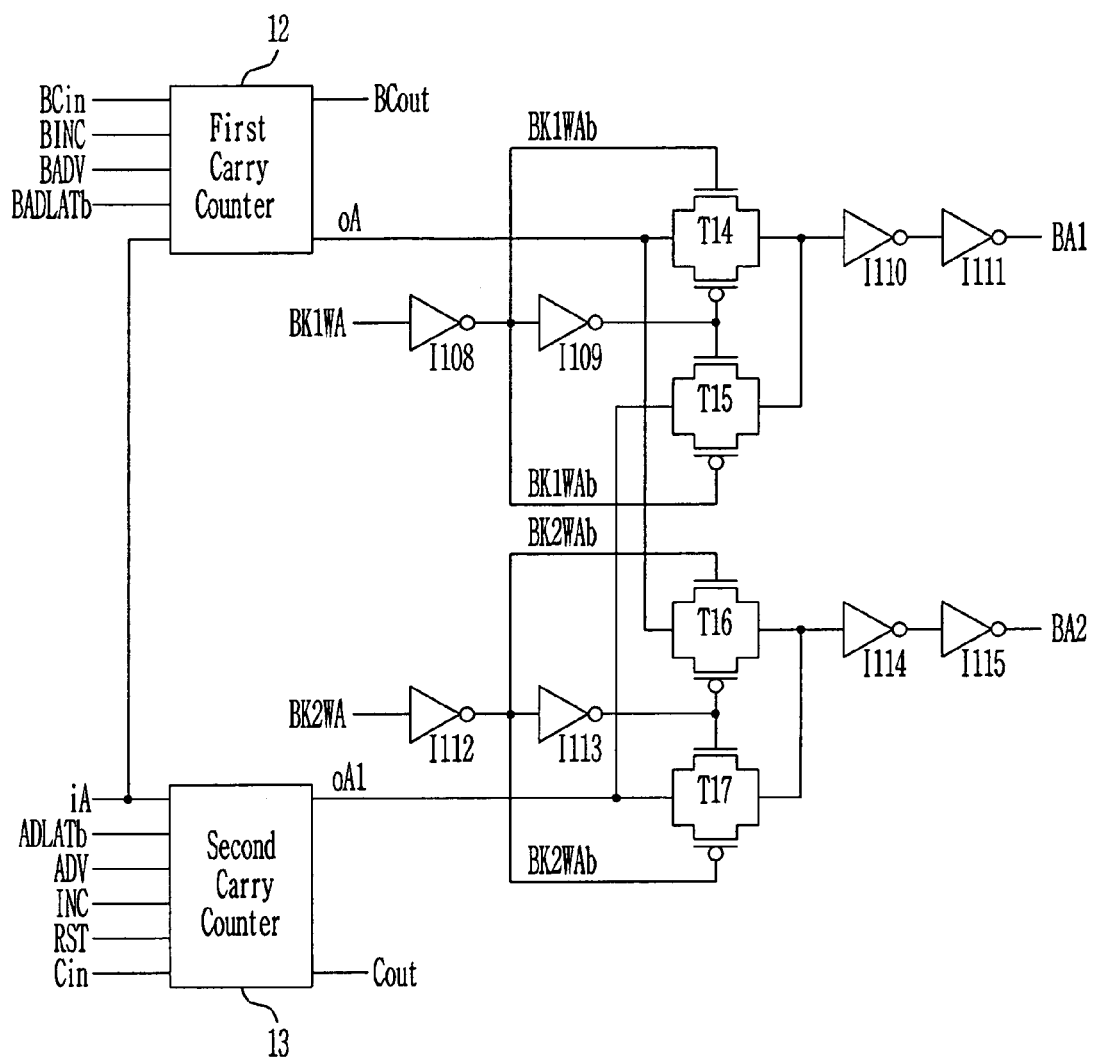

FIG. 1 illustrates a bank select circuit that is driven regardless of location of the boot region according to one embodiment of the present invention. The structure of the bank select circuit will be described by reference to FIG. 1.

A first inverter I101 inverts a control signal DWEBi and a second inverter I102 inverts the output signal of the first inverter I101. The control signal DWEBi is a signal inputted through a word line enable pad, which is inputted through the buffer and inverter. A first transfer gate T11 is driven by the output signal of the first inverter I101 and output signal of the second inverter I102 to transfer an address signal AF inputted through the buffer. A latch means 11 having a third inverter I103 and a fourth inverter I104 latches the address signal AF transferred through the first transfer gate T11. A fifth inverter I105 inverts the output signal of the latch means 11.

A sixth inverter I106 inverts a boot location select signal TOPCFG1 and a seventh inverter I107 inverts the output signal of the sixth inverter I106. At this time, the boot location select signal TOPCFG1 is a signal to select location of the boot region, wherein the signal is coded in a common flash interface (hereinafter called "CFI") block, or generated depending on the status of an OTP (one time program) cell in the protection block, or generated by applying the power supply voltage or the ground voltage as a metal option. A second transfer gate T12 is driven by the output signals of the sixth and seventh inverters I106 and I107 to transfer the output signal of the fifth inverter I105 that inverts the output signal of the latch means 11. A third transfer gate T13 is driven by the output signals of the sixth and seventh inverters I106 and I107 to transfer the output signal of the latch means 11. In other words, the second and third transfer gates T12 and T13 reciprocally operate according to the outputs of the sixth and seventh inverters I106 and I107 to output the output signal of the fifth inverter I105 or the output signal of the latch means 11.

A first carry counter 12 receives the output signal iA of the second transfer gate T12 or the third transfer gate T13, a first carry input signal BCin and a plurality of control signals BADLATb, BADV, BINC to output a bank read signal oA and a first carry output signal BCout. Meanwhile, a second carry counter 13 receives the output signal iA of the second transfer gate T12 or the third transfer gate T13, a second carry input signal Cin and a plurality of control signals ADLATb, ADV, INC, RST to output a bank write signal oA1 and a second carry output signal Cout.

An eighth inverter I108 inverts a first bank select signal BK1WA and a ninth inverter I109 inverts the output signal of the eighth inverter I108. A fourth transfer gate T14 is driven by the first bank select signal BK1WA and its inverted signal BW1WAb to transfer the bank read signal oA. A fifth transfer gate T15 is driven by the first bank select signal BK1WA and its inverted signal BW1WAb to transfer the bank write signal oA1. In other words, the fourth and fifth transfer gates T14 and T15 are reciprocally driven by the first bank select signal BK1WA and its inverted signal BW1WAb to transfer the bank read signal oA or the bank write signal oA1. The bank read signal oA or the bank write signal oA1 that were transferred through the fourth transfer gate T14 or the fifth transfer gate T15, are inputted to a first bank BA1 via tenth and eleventh inverters I110 and I111, which then control the read or write operation of the first bank BA1.

A twelfth inverter I112 inverts a second bank select signal BK2WA and a thirteenth inverter I113 inverts the output signal of the twelfth inverter I112. A sixth transfer gate T16 is driven by the second bank select signal BK2WA and its inverted signal BK2WAb to transfer the bank read signal oA. A seventh transfer gate T17 is driven by the second bank select signal BK2WA and its inverted signal BK2WAb to transfer the bank write signal oA1. In other words, the sixth and seventh transfer gates T16 and T17 are reciprocally driven by the second bank write signal BK2WA and its inverted signal BK2WAb to transfer the bank read signal oA or the bank write signal oA1. The bank read signal oA or the bank write signal oA1 that were transferred through the sixth transfer gate T16 or the seventh transfer gate T17, are inputted to a second bank BA2 via fourteenth and fifteenth inverters I114 and I115, which then control the read or write of the second bank BA2.

A method of driving the bank select circuit constructed above that is driven regardless of location of the boot region according to the present invention will be described.

The control signal DWEBi of a High state is inverted to a Low state via the first inverter I101 and is then inverted to a High state via the second inverter I102. Therefore, the first transfer gate T11 is turned on by the output signal of the first inverter I101 of the Low state and the output signal of the second inverter I102 of the High state to transfer the address signal AF. Next, the address signal AF transferred through the first transfer gate T11 is latched in the latch means 11 having the third and fourth inverters I103 and I104.

The signal latched by the latch means 11 is inverted by the fifth inverter I105 and is then transferred via the second transfer gate T12 or via the third transfer gate T13. The second and third transfer gates T12 and T13 reciprocally operate according to the status of the boot location select signal TOPCFI1. For example, if the boot location select signal TOPCFG1 is applied as a High state in order to select the boot region at the top of the memory cell array, the boot location select signal TOPCFG1 is inverted to a Low state by the sixth inverter I106 and is then again inverted to a High state by the seventh inverter I107. Thereby, the second transfer gate T12 is turned off and the third transfer gate T13 is turned on, so that the signal latched in the latch means 11 is transferred via the third transfer gate T13 (iA). On the contrary, if the boot location select signal TOPCFG1 is applied as a Low state in order to select the boot region at the bottom of the memory cell array, the boot location select signal TOPCFG1 is inverted to a High state by the sixth inverter I106 and is then again inverted to a Low state by the seventh inverter I107. Thereby, the second transfer gate T12 is turned on and the third transfer gate T13 is turned off, so that the signal latched in the latch means 11 is inverted by the fifth inverter I105 and is then transferred via the second transfer gate T12 (iA). Therefore, if the address signal AF is at High state, the signal iA transferred via the second transfer gate T102 keeps a High state and the signal iA transferred via the third transfer gate T103 keeps a Low state. On the contrary, if the address signal AF is at Low state, the signal iA transferred via the second transfer gate T12 keeps a Low state and the signal iA transferred via the third transfer gate T13 keeps a High state.

The first carry counter 12 outputs the bank read signal oA and first carry output signal BCout according to the signal iA transferred through the second or third transfer gate T12 or T13 and the plurality of the control signals BADLATb, BADV, BINC and the first carry input signal BCin. At this time, the bank read signal oA is outputted as the Low state when the signal iA keeps a Low state and the first carry input signal BCin keeps a Low state. The bank read signal oA is outputted as a Low state when the signal iA keeps a Low state and the first carry input signal BCin keeps a High state. Furthermore, the bank read signal oA is outputted as a High state when the signal iA keeps a High state and the first carry input signal BCin keeps a Low state. The bank read signal oA is outputted as a Low state when the signal iA keeps a High state and the first carry input signal BCin keeps a High state.

Meanwhile, the second carry counter 13 outputs the bank write signal oA1 and the second carry output signal Cout according to the signal iA transferred through the second or third transfer gate T12 or T13 and the plurality of the control signals ADLATb, ADV, INC, RST and the second carry input signal Cin. At this time, the bank write signal oA1 is outputted as a Low state when the signal iA keeps a Low state and the second carry input signal Cin keeps a Low state. Also, the bank write signal oA1 is outputted as a Low state when the signal iA keeps a Low state and the second carry input signal Cin keeps a High state. Furthermore, the bank write signal oA1 is outputted as a High state when the signal iA keeps a High state and the second carry input signal Cin keeps a Low state. Also, the bank write signal oA1 is outputted as a Low state when the signal iA keeps a High state and the second carry input signal Cin keeps a High state.

If the first bank select signal BK1WA is applied as a High state and the second bank select signal BK2WA is applied as a Low state, the fourth transfer gate T14 is turned off and the fifth transfer gate T15 is turned on, by the first bank select signal BK1WA and its inverted signal BK1WAb, so that the bank write signal oA1 is applied to the first bank BA1, which then controls the write operation of the first bank BA1. Furthermore, the sixth transfer gate T16 is turned on and the seventh transfer gate T17 is turned off, by the second bank select signal BK2WA and its inverted signal BK2WAb, so that the bank read signal oA is applied to the second bank BA2, which then controls the read operation of the second bank BA2.

Meanwhile, if the first bank select signal BK1WA is applied as a Low state and the second bank select signal BK2WA is applied as a High state, the fourth transfer gate T14 is turned on and the fifth transfer gate T15 is turned off by the first bank select signal BK1WA and its inverted signal BK1WAb, so that the bank read signal oA is applied to the first bank BA1, which then controls the read operation of the first bank BA1. Furthermore, the sixth transfer gate T16 is turned off and the seventh transfer gate T17 is turned on by the second bank select signal BK2WA and its inverted signal BK2WAb, so that the bank write signal oA1 is applied to the second bank BA2, which then controls the write operation of the second bank BA2.

As described above, the bank select circuit in the flash memory device according to the present invention is driven regardless of the boot location select signal to control the read and write operation of the bank. In other words, in the flash memory device of the present invention, the bank select circuit needs not to be modified even though location of the boot region is changed after the design is completed.

Figure 2:
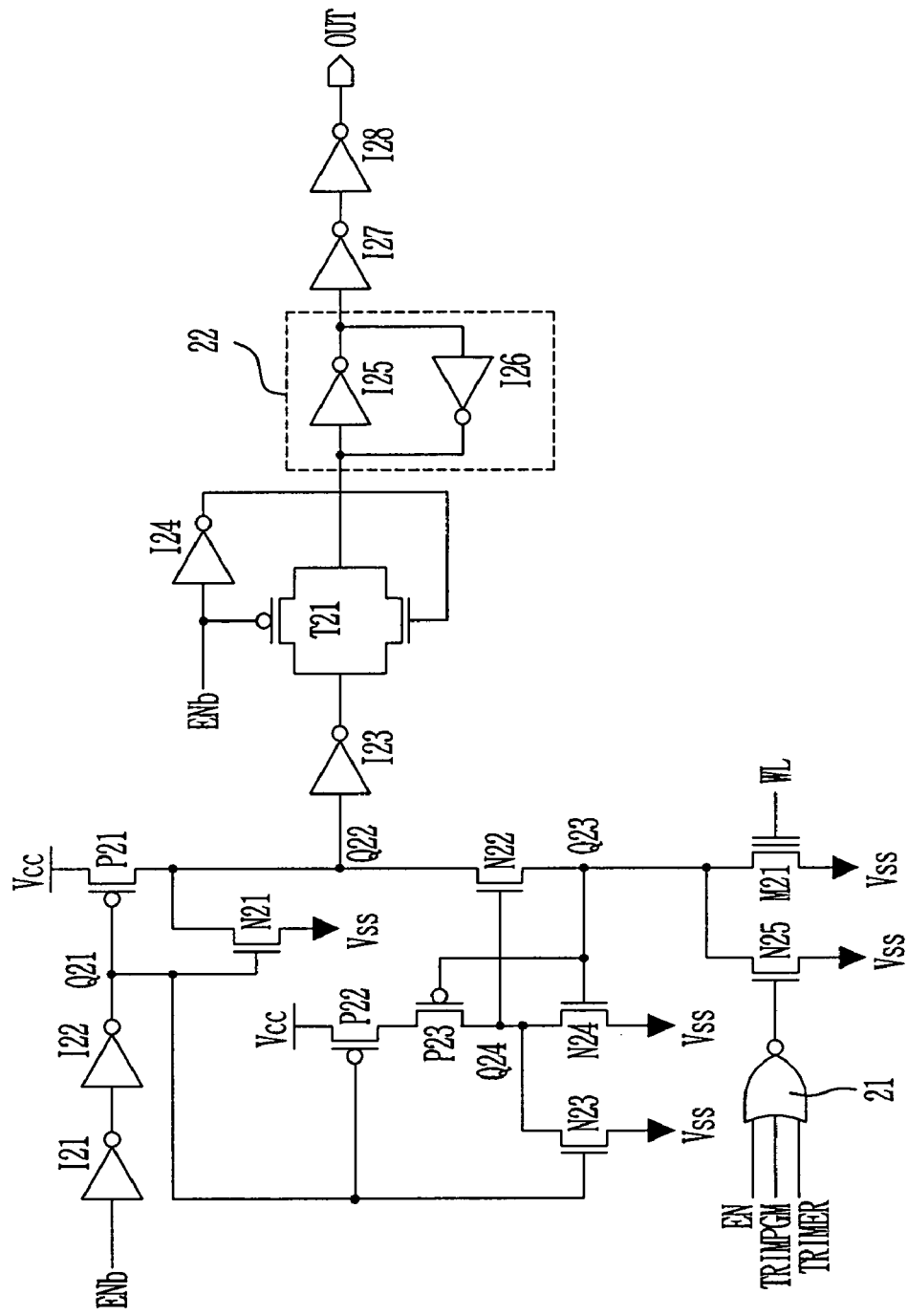
FIG. 2 is a circuit for generating a boot location select signal according to a first embodiment of the present invention.

FIG. 2 is a circuit for generating a boot location select signal according to a first embodiment of the present invention. The circuit senses the state of an OTP cell in a protection block to select a boot location depending on its state. The construction of the circuit for generating the boot location select signal will be now described.

A first inverter I21 inverts an enable bar signal ENb and a second inverter I22 inverts again the output of the first inverter I21, so that the potential of the first node Q21 is decided. A first PMOS transistor P21 connected between the power supply terminal Vcc and a second node Q22 is driven by the potential of a first node Q21. A first NMOS transistor N21 connected between the second node Q22 and the ground terminal Vss is driven by the potential of the first node Q21. A second NMOS transistor N22 connected between the second node Q22 and a third node Q23 is driven by the potential of a fourth node Q24. A memory cell M21 is connected between the third node Q23 and the ground terminal Vss. In the above, the memory cell M21 is an OTP cell existing in the protection block. Location of the boot region is decided depending on the state of the OTP cell. For example, if the memory cell M21 is to be programmed, location of the boot region becomes the top of the memory cell array. If the memory cell M21 is to be erased, location of the boot region becomes the bottom of the memory cell array.

A second PMOS transistor P22 and a third PMOS transistor P23 are serially connected between the power supply terminal Vcc and the fourth node Q24. The second PMOS transistor P22 is driven by the potential of the first node Q21 and the third PMOS transistor P23 is driven by the potential of the third node Q23. A third NMOS transistor N23 and a fourth NMOS transistor N24 are connected in parallel between the fourth node Q24 and the ground terminal Vss. The third NMOS transistor N23 is driven by the potential of the first node Q21 and the fourth NMOS transistor N24 is driven by the potential of the third node Q23. These second and third PMOS transistors P22 and P23 and the third and fourth NMOS transistors N23 and N24 serve as a self regulator for constantly keeping the potential of the third node Q23.

A fifth NMOS transistor N25 that is driven by the output signal of the NOR gate 21, is connected between the third node Q23 and the ground terminal Vss. The NOR gate 21 logically combines an enable signal EN, a program signal TRIMPGM and an erase signal TRIMER.

The potential of the second node Q22 is inverted by the third inverter I23 and the output signal of the third inverter I23 is transferred through the transfer gate T21. The transfer gate T21 is driven by the second inverter I22 for inverting the enable bar signal ENb and the enable bar signal ENb. The signal transferred via the transfer gate T21 is latched by the latch means 21 having fifth and sixth inverters I25 and I26. The output signal of the latch means 21 is outputted to the output terminal OUT via the seventh and eighth inverters I27 and I28.

The circuit for generating the boot location select signal constructed above according to a first embodiment of the present invention operates same to the common sensing circuit. The operation of the circuit for generating the boot location select signal will be described in short.

If the OTP cell of the protection block is at program state, the second node Q22 keeps a High state. The potential of the second node Q22 that keeps the High state is inverted to a Low state through the third inverter I24. The output signal of the third inverter I23 that keeps a Low state is transferred to the transfer gate T21 that is driven by the enable bar signal ENb and the output signal of the fourth inverter I24 for inverting the enable bar signal ENb. The signal transferred through the transfer gate T21 is latched by the latch means 22 having the fifth and sixth inverters I25 and I26 and is then outputted as a High state. The signal latched in the latch means 22 keeps the potential of the High state through the seventh and eighth inverters I27 and I28 and is then outputted to the output terminal OUT.

Meanwhile, if the OTP cell in the protection block is at erase state, the second node Q22 keeps a Low state. The potential of the second node Q22 that keeps the Low state is inverted to a High state through the third inverter I24. The output signal of the third inverter I23 that keeps the High state is transferred to the transfer gate T21 that is driven by the enable bar signal ENb and the output signal of the fourth inverter I24 for inverting the enable bar signal ENb. The signal transferred through the transfer gate T21 is latched by the latch means 22 having the fifth and sixth inverters I25 and I26 and is then outputted as a Low state. The signal latched in the latch means 22 keeps the potential of the Low state through the seventh and eighth inverters I27 and I28 and is then outputted to the output terminal OUT.

As described above, in the circuit for generating the boot location select signal according to one embodiment of the present invention, if the OTP cell of the protection block is at program state, the boot location select signal is outputted as a High state and the top of the memory cell array is selected as the boot location. If the OTP cell is at erase state, the signal is outputted as a Low state and the bottom of the memory cell array is selected as the boot location.

Figure 3:
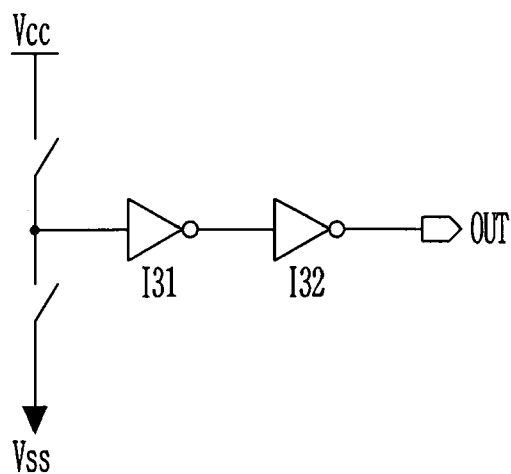
FIG. 3 is a circuit for generating the boot location select signal according to a second embodiment of the present invention.

FIG. 3 is a circuit for generating the boot location select signal according to a second embodiment of the present invention. The circuit could decide location of the boot, by selectively connecting the power supply terminal Vcc or the ground terminal Vss to the output terminal OUT to decide the potential of the output terminal. In other words, if the power supply terminal Vcc is connected, the power supply voltage Vcc is outputted to the output-terminal OUT via the first and second inverters I31 and I32. If the ground terminal Vss is connected, the ground voltage Vss is outputted to the output terminal OUT via the first and second inverters I31 and I32. At this time, location of the boot is decided depending on the potential of the output terminal OUT. For example, if the potential of the power supply voltage Vcc is kept, location of the boot becomes the top of the memory cell array. If the potential of the ground voltage Vss is kept, location of the boot becomes the bottom of the memory cell array.

Figure 4:
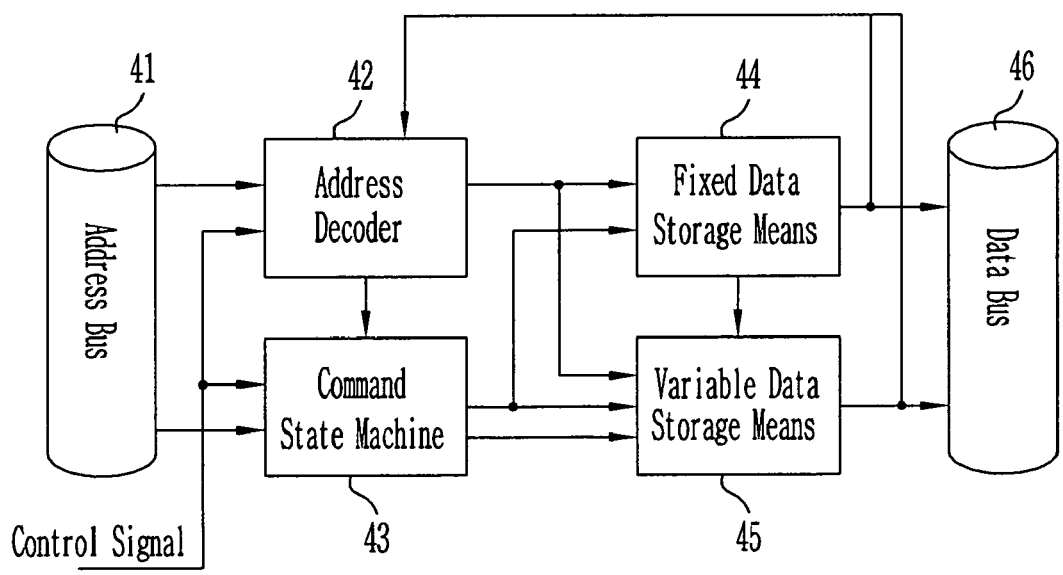
FIG. 4 is a circuit for generating the boot location select signal according to a third embodiment of the present invention.

FIG. 4 is a circuit for generating the boot location select signal by coding it in a CFI block according to another embodiment of the present invention. The construction of the circuit will be described.

A fixed data storage means 44 is to store information the possibility of change is little. For example, this storage means includes a storage means for which write and erase are impossible such as PLA. A variable data storage means 45 is to store information the possibility of change is high. For example, this storage means includes a storage means for which write and erase are possible such as the memory cell. The boot location select signal is coded and stored at this fixed data storage means 44 or the variable data storage means 45. The address decoder 42 decodes the address signal inputted through the address bus 41 and the control signal inputted through a given control line to specify addresses of the fixed data storage means 44 and the variable data storage means 45. A command state machine 43 determines whether to read information of the fixed data storage means 44 and variable data storage means 45, delete information stored at the variable data storage means 45 or replace it with new information, according to a decoded signal inputted from the address decoder 42. Information stored at the fixed data storage means 44 and variable data storage means 45, which is read according to the command state machine 43, is outputted via a data bus 46.

A method of driving the circuit for generating the boot location select signal by coding it in the CFI block according to another embodiment of the present invention, will be below described.

The boot location select signal is coded and stored at the fixed data storage means 44 or the variable data storage means 45. The address decoder 42 decodes the address signal and the control signal from the system, which are inputted through the address bus 41 and a given control line and then stores addresses of the fixed data storage means 44 and variable data storage means 45. At the same time, the command state machine 43 receives the control signal from the system and the decoded signal from the address decoder 42 to confirm a command corresponding to a specified address. In other words, the decoded signal inputted from the address decoder 42 decides whether to read information of the variable data storage means 44 and the fixed data storage means 45, delete information stored at the fixed data storage means 45 or replace it with new information. These read, write and delete operations are implemented according to the internal structure of each of the variable data storage means 44 and the fixed data storage means 45. The output value accordingly thereto, i.e., a corresponding code is outputted via the data bus 46. However, in the operation of deleting information stored at the variable data storage means 45 or writing new information, a flag being a signal indication the operation status not a code is loaded onto the data bus 46.

Meanwhile, although examples of the top and bottom boot regions have been described in the above embodiments of the present invention, the present invention is not limited to it. Instead, the present invention may be applied to the flash memory devices located at both ends of the bottom and top.

As described above, according to the present invention, the boot location select signal for selecting location of the boot region is generated by coding it in the CFI block, generated depending on the state of the OTP cell in the protection block, or generated by applying the power supply voltage or the ground voltage as a metal option. Therefore, the present invention has advantageous effects that it can shorten development time, simplify the verification work and reduce the size of a chip, since the bank select circuit needs not be modified even though location of the boot region is changed.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A flash memory device, comprising:
    a latch means for latching an address signal;
    a first switching means for selectively outputting an output signal of the latch means or its inverted signal according to a boot location select signal and its inverted signal;
    a first carry counter for outputting a bank read signal and a first carry output signal according to the output signal of the first switching means, a first carry input signal and a plurality of control signals;
    a second carry counter for outputting a bank write signal and a second carry output signal according to the output signal of the first switching means, a second carry input signal and the plurality of the control signals;

a second switching means for selectively outputting the bank read signal or the bank write signal to control the operation of a first bank, according to a first bank select signal and its inverted signal; and a third switching means for selectively outputting the bank read signal or the bank write signal to control the operation of a second bank, according to a second bank select signal and its inverted signal.

2. The flash memory device as claimed in claim 1, wherein the boot location select signal is coded and generated in a fixed data storage means or a variable data storage means.

3. The flash memory device as claimed in claim 1, wherein the boot location select signal is generated depending on the state of an OTP cell in a protection block.

4. The flash memory device as claimed in claim 1, wherein the boot location select signal is generated by a high voltage or a low voltage that is generated by applying a power supply voltage or a ground voltage.

5. The flash memory device as claimed in claim 1, wherein the first switching means comprises:

a first transfer gate driven by the boot location select signal and its inverted signal, for transferring an inverted signal of the output signal of the latch means; and a second transfer gate driven by the boot location select signal and its inverted signal, for transferring the output of the latch means, wherein the first and second transfer gates reciprocally operate.

6. The flash memory device as claimed in claim 1, wherein the second switching means comprises:

a first transfer gate for outputting the bank read signal according to the first bank select signal and its inverted signal; and a second transfer gate for outputting the bank write signal according to the first bank select signal and its inverted signal, wherein the first and second transfer gates reciprocally operate.

7. The flash memory device as claimed in claim 1, wherein the third switching means comprises:

a first transfer gate for outputting the bank read signal according to the second bank select signal and its inverted signal; and a second transfer gate for outputting the bank write signal according to the second bank select signal and its inverted signal, wherein the first and second transfer gates reciprocally operate.

* * * * *